US012763791B2

(12) United States Patent
Wang

(10) Patent No.: US 12,763,791 B2
(45) Date of Patent: Oct. 13, 2026

(54) ANALOG-TO-DIGITAL CONVERTER CIRCUIT, DIGITAL FILTER CIRCUIT, AND CONTROL METHOD THEREOF

(71) Applicant: Nuvoton Technology Corporation, Hsinchu Science Park (TW)

(72) Inventor: Cheng-Chih Wang, Jhubei City (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 137 days.

(21) Appl. No.: 18/760,894

(22) Filed: Jul. 1, 2024

(65) Prior Publication Data

US 2025/0038763 A1 Jan. 30, 2025

(30) Foreign Application Priority Data

Jul. 24, 2023 (TW) ................................. 112127456

(51) Int. Cl.
*H03M 3/00* (2006.01)

(52) U.S. Cl.
CPC ........... *H03M 3/496* (2013.01); *H03M 3/436* (2013.01)

(58) Field of Classification Search
CPC ...... H03M 3/496; H03M 3/464; H03M 3/422; H03M 3/388; H03M 3/424; H03M 3/436; H03M 1/0626; H03M 1/066; H03M 3/344; H03M 3/368; H03M 3/458; H03M 3/462; H03M 3/466; H03M 3/472; H03M 3/474; H03M 3/50; H03M 1/00; H03M 1/001; H03M 1/002; H03M 1/005; H03M 1/007; H03M 1/008; H03M 1/0854; H03M 1/1009; H03M 1/1019; H03M 1/12; H03M 1/1245; H03M 1/129; H03M 1/16; H03M 1/183; H03M 1/42; H03M 1/56; H03M 1/822; H03M 3/30; H03M 3/346; H03M 3/37; H03M 3/426; H03M 3/438; H03M 3/454;

(Continued)

(56) References Cited

U.S. PATENT DOCUMENTS 5,420,584 A * 5/1995 Norsworthy .......... H03M 3/488 341/110
5,627,536 A * 5/1997 Ramirez ............... H03M 3/474 341/143

(Continued)

FOREIGN PATENT DOCUMENTS

CN 107538020 A 1/2018
CN 07835024 A 3/2018

(Continued)

*Primary Examiner* — Linh V Nguyen
(74) *Attorney, Agent, or Firm* — MUNCY, GEISSLER, OLDS & LOWE, P.C.

(57) ABSTRACT

An analog-to-digital converter (ADC) circuit including a receiving circuit and a delta-sigma ADC is provided. The receiving circuit receives a first analog input and a second analog input, and uses the first or second analog input as an output signal according to a control signal. The delta-sigma ADC converts the output signal to input data. The delta-sigma ADC over-samples the input data to generate a plurality of sampling results and stores the sampling results. The delta-sigma ADC generates output data according to the sampling results.

18 Claims, 5 Drawing Sheets

(58) Field of Classification Search
CPC ........ H03M 3/46; H03M 3/478; H03M 3/494; H03M 3/498; H03M 3/504
USPC .......................................... 341/143, 141, 142
See application file for complete search history.

(56) References Cited

U.S. PATENT DOCUMENTS

| | | | | | |
|---|---|---|---|---|---|
| 5,646,621 | A * | 7/1997 | Cabler | H03M 3/344 | 708/313 |
| 5,805,479 | A * | 9/1998 | Tang | H03H 17/0292 | 708/316 |
| 5,870,047 | A * | 2/1999 | Piesinger | H03M 1/662 | 375/317 |
| 6,081,216 | A * | 6/2000 | May | H03M 3/462 | 341/61 |
| 6,208,279 | B1 * | 3/2001 | Oprescu | H03M 3/374 | 341/143 |
| 6,426,713 | B1 * | 7/2002 | Amar | H03M 1/1028 | 341/120 |
| 7,102,548 | B1 * | 9/2006 | Wang | H03H 17/0671 | 708/313 |
| 7,142,606 | B2 * | 11/2006 | Talwalkar | H03M 3/474 | 375/259 |
| 7,856,464 | B2 * | 12/2010 | Tinker | H03H 17/0671 | 708/313 |
| 8,645,441 | B2 * | 2/2014 | Willson | H03H 17/0225 | 708/313 |
| 9,541,190 | B2 * | 1/2017 | Kim | F16H 59/105 | |
| 2017/0222627 | A1 * | 8/2017 | Kajita | H03H 17/0671 | |
| 2023/0017433 | A1 * | 1/2023 | Cappello | H03H 17/0664 | |

FOREIGN PATENT DOCUMENTS

| | | | |
|---|---|---|---|
| CN | 110858768 | A | 3/2020 |
| TW | 201220713 | A | 5/2012 |
| TW | I702795 | B | 8/2020 |

* cited by examiner

ANALOG-TO-DIGITAL CONVERTER CIRCUIT, DIGITAL FILTER CIRCUIT, AND CONTROL METHOD THEREOF

CROSS REFERENCE TO RELATED APPLICATIONS

This application claims priority of Taiwan Patent Application No. 112127456, filed on Jul. 24, 2023, the entirety of which is incorporated by reference herein.

BACKGROUND OF THE INVENTION

Field of the Invention

The present invention relates to an analog-to-digital converter (ADC) circuit, and, in particular, to an ADC circuit that comprises a plurality of channels.

Description of the Related Art

With technological development, the functions and types of electronic devices have increased. Most electronic devices have an analog-to-digital converter (ADC). The ADC can convert an analog signal into a digital signal. However, if there are multiple analog signals that need to be converted, multiple ADCs are needed.

BRIEF SUMMARY OF THE INVENTION

In accordance with an embodiment of the disclosure, an analog-to-digital converter (ADC) circuit comprises a receiver circuit and a delta-sigma ADC. The receiver circuit receives a first analog input and a second analog input and uses the first analog input or the second analog input as an output signal according to a control signal. The delta-sigma ADC converts the output signal to generate output data and comprises a differential amplifier, an integrator, a quantizer, a digital-to-analog converter (DAC) circuit, and a digital filter circuit. The differential amplifier amplifies the difference between the output signal and a reference signal to generate an amplified signal. The integrator accumulates the amplified signal to generate an integrated signal. The quantizer quantizes the integrated signal to generate input data. The DAC circuit converts the input data to generate the reference signal. The digital filter circuit over-samples the input data according to the control signal to generate the output data.

In accordance with another embodiment of the disclosure, a digital filter circuit over-samples input data to generate output data and comprises an integrator circuit, a frequency reduction circuit, and a comb filter circuit. The integrator circuit comprises a first integrator and a second integrator. The first integrator comprises a first adder, a first selector circuit, a first register, a second register, and a second selector circuit. The first adder adds the input data and a first register value to generate a first calculation value. The first selector circuit selects the first calculation value as a first output value or a second output value according to a control signal. The first register stores the first output value. The second register stores the second output value. The second selector circuit selects the first output value stored in the first register or the second output value stored in the second register as the first register value according to the control signal. The second integrator is connected to the first integrator in series and comprises a second adder, a third selector circuit, a third register, a fourth register, and a fourth selector circuit. The second adder adds the first calculation value and a second register value to generate a second calculation value. The third selector circuit selects the second calculation value as a third output value or a fourth output value according to the control signal. The third register stores the third output value. The fourth register stores the fourth output value. The fourth selector circuit selects the third output value stored in the third register or the fourth output value stored in the fourth register as the second register value according to the control signal. The frequency reduction circuit down-samples the second calculation value to generate a processed value. The comb filter circuit comprises a first comb filter and a second comb filter. The first comb filter comprises a first subtractor, a fifth selector circuit, a fifth register, a sixth register, and a sixth selector circuit. The first subtractor subtracts a third register value from the processed value to generate a third calculation value. The fifth selector circuit selects the processed value as a fifth output value or a sixth output value according to the control signal. The fifth register stores the fifth output value. The sixth register sores the sixth output value. The sixth selector circuit selects the fifth output value stored in the fifth register or the sixth output value stored in the sixth register as the third register value according to the control signal. The second comb filter comprises a second subtractor, a seventh selector circuit, a seventh register, an eighth register, and an eighth selector circuit. The second subtractor subtracts a fourth register value from the third calculation value to generate a fourth calculation value. The seventh selector circuit selects the third calculation value as a seventh output value or an eighth output value according to the control signal. The seventh register stores the seventh output value. The eighth register sores the eighth output value. The eighth selector circuit selects the seventh output value stored in the seventh register or the eighth output value stored in the eighth register as the fourth register value according to the control signal.

An exemplary embodiment of a control method for a ADC circuit is described in the following paragraph. A first analog input is received from a first sensing circuit. A second analog input is received from a second sensing circuit. The first analog input or the second analog input is used as an output signal according to a control signal. The output signal is converted to generate output data. The output signal is an analog signal, and the output data is digital data. In response to the first analog input being used as the output signal, the output signal is over-sampled to generate a plurality of first sampled results, the first sampled results are stored in a first register circuit, and the output data is generated according to the first sampled results. In response to the second analog input being used as the output signal, the output signal is over-sampled to generate a plurality of second sampled results, the second sampled results are stored in a second register circuit, and the output data is generated according to the second sampled results.

The control method may be practiced by the ADC circuit which have hardware or firmware capable of performing particular functions and may take the form of program code embodied in a tangible media. When the program code is loaded into and executed by an electronic device, a processor, a computer or a machine, the electronic device, the processor, the computer or the machine becomes an ADC circuit for practicing the disclosed method.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
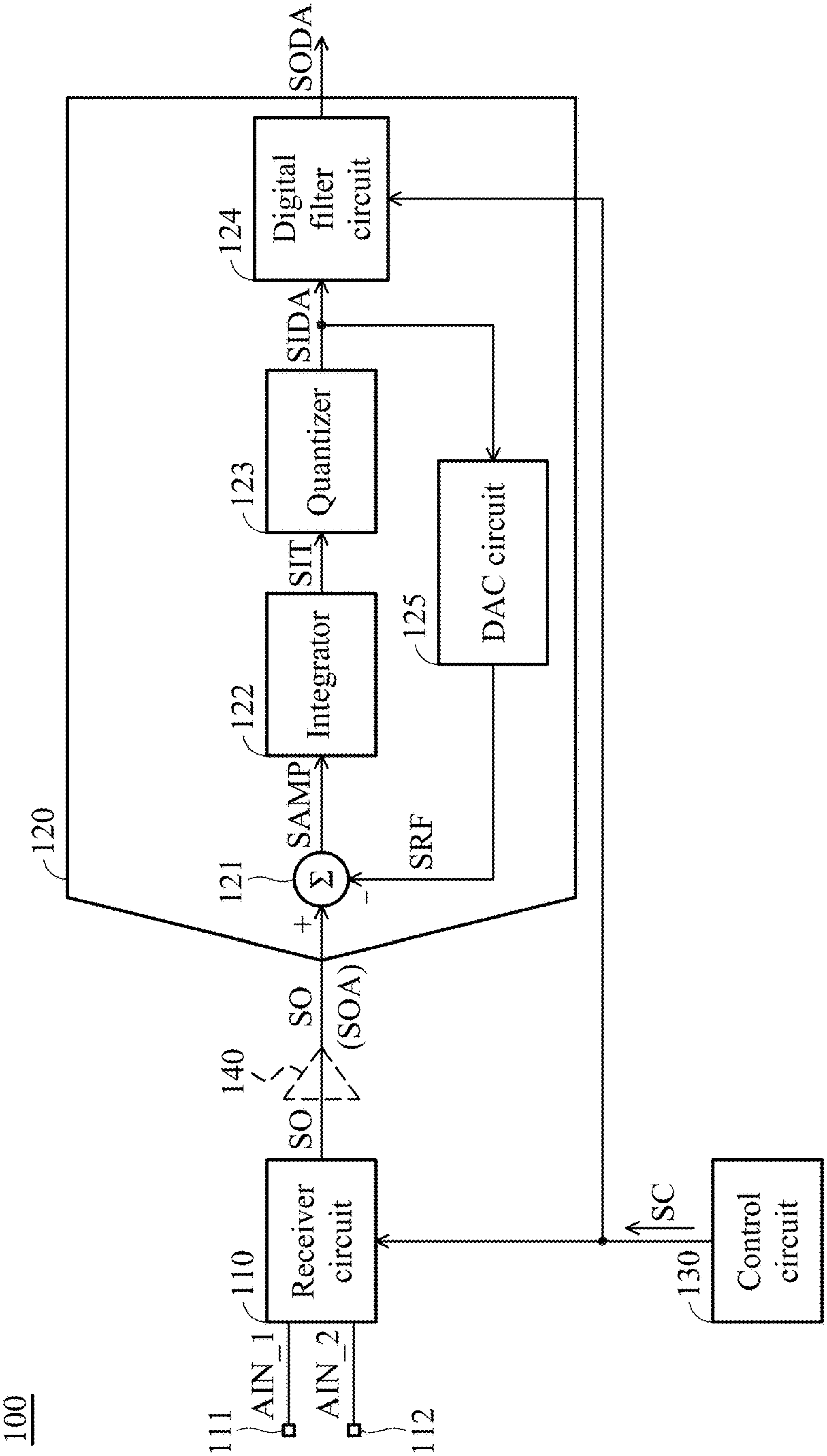
FIG. 1 is a schematic diagram of an exemplary embodiment of an analog-to-digital converter (ADC) circuit according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an analog-to-digital converter (ADC) circuit according to various aspects of the present disclosure. The ADC circuit 100 comprises a receiver circuit 110 and a delta-sigma ADC 120. The receiver circuit 110 is coupled to the channel 111 to receive the analog input AIN_1. The receiver circuit 110 is also coupled to the channel 112 to receive the analog input AIN_2. The receiver circuit 110 uses the analog input AIN_1 or the analog input AIN_2 as an output signal SO according to a control signal SC. The structure of receiver circuit 110 is not limited in the present disclosure. In one embodiment, receiver circuit 110 is a multiplexer.

In other embodiments, the ADC circuit 100 further comprises a control circuit 130. The control circuit 130 sets the control signal SC to change between a first state (e.g., a low level) and a second state (e.g., a high level) successively according to a set value (not shown). For example, when the set value is a specific value (e.g., 0), the control circuit 130 sets the control signal SC to a first state. At this time, the receiver circuit 110 may use the analog input AIN_1 as the output signal SO. When the set value is not the specific value, the control circuit 130 sets the control signal SC to a second state. At this time, the receiver circuit 110 may use the analog input AIN_2 as the output signal SO. The set value may be written into the control circuit 130 in advance. In other embodiment, the user may adjust the set value arbitrarily according to actual needs. In other words, the user may utilize the control circuit 130 to direct the receiver circuit 110 to use a corresponding analog input as the output signal SO.

The number of control signals is not limited in the present disclosure. In one embodiment, when the receiver circuit 110 receives more analog inputs, the control circuit 130 provides more control signals. The receiver circuit 110 selects an appropriate analog input according to the levels of all control signals.

The number of channels is not limited in the present disclosure. In other embodiments, the receiver circuit 110 is coupled to more or fewer channels. In one embodiment, the channel 111 is coupled to a first sensing circuit, and the channel 112 is coupled to the second sensing circuit. The physical characteristics (e.g., a temperature or a humidity) or electrical characteristics (a voltage, a current, or a frequency) sensed by the first sensing circuit may be the same as or different from the physical characteristics or electrical characteristics sensed by the second sensing circuit. For example, the first sensing circuit may configure to sense a temperature, and the second sensing circuit is configured to sense an external voltage. In this case, the sensed signal generated by the first sensing circuit may be used as the analog input AIN_1, and the sensed signal generated by the second sensing circuit may be used as the analog input AIN_2.

In one embodiment, each of the analog input AIN_1 and the analog input AIN_2 is a differential signal. In this case, the output signal SO is also a differential signal. In another embodiment, the receiver circuit 110 comprises a conversion circuit (not shown) to convert the analog input AIN_1 or the analog input AIN_2 into a differential signal. In this case, the differential signal generated by the conversion circuit is used as the output signal SO.

In some embodiments, the ADC circuit 100 further comprises a programable gain amplifier (PGA) 140. The PGA 140 is coupled between the receiver circuit 110 and the delta-sigma ADC 120. The PGA 140 amplifies the output signal SO to generate an amplified signal SOA.

The delta-sigma ADC 120 converts the output signal SO or the amplified signal SOA to generate output data SODA. In this embodiment, the delta-sigma ADC 120 comprises a differential amplifier 121, an integrator 122, a quantizer 123, a digital filter circuit 124 and a digital-to-analog converter (DAC) circuit 125.

The differential amplifier 121 amplifies the difference between the output signal SO and a reference signal SRF to generate an amplified signal SAMP. The integrator 122 accumulates the amplified signal SAMP to generate an integrated signal SIT. The quantizer quantizes the integrated signal SIT to generate input data SIDA. The DAC circuit 125 converts the input data SIDA to generate the reference signal SRF. The digital filter circuit 124 over-samples the input data SIDA according to the control signal SC to generate the output data SODA.

For example, when the control signal SC matches a predetermined state (e.g., a low level), the receiver circuit 110 uses the analog input AIN_1 as the output signal SO. The digital filter circuit 124 over-samples the input data SIDA to generate a plurality of first sampled results and stores the first sampled results in a first register circuit. After a settling time, the digital filter circuit 124 finishes an over-sampling operation. Then, the digital filter circuit 124 generates the output data SODA according to the first sampled results. When the control signal SC does not match a predetermined state, for example the control signal SC is a high level, the receiver circuit 110 uses the analog input AIN_2 as the output signal SO. The digital filter circuit 124 over-samples the input data SIDA to generate a plurality of second sampled results and stores the second sampled results in a second register circuit. After a settling time, the digital filter circuit 124 finishes an over-sampling operation. Then, the digital filter circuit 124 generates the output data SODA according to the second sampled results.

In this embodiment, the input data SIDA may have one bit. After the digital filter circuit 124 performs the over-sampling operation for the input data SIDA, the number of bits input data SIDA may be expanded into various bits. For example, assuming the digital filter circuit 124 performs 34 over-sampling operations for the input data SIDA. In this case, the settling time of the digital filter circuit 124 is the total time of 34 over-sampling operations. In other words, after 34 over-sampling operations, the sampled data reaches stability. Therefore, the digital filter circuit 124 generates the output data SODA according to the sampled data.

In one embodiment, the digital filter circuit 124 may shift the sampled results. For example, the digital filter circuit 124 selects the values of higher 24 bits and omits the values of lower 10 bits. In some embodiments, the digital filter circuit 124 may use 34-bit sampled data as the output data SODA.

When the receiver circuit 110 uses the analog input AIN_1 as the output signal SO, the digital filter circuit 124 stores the first sampled results in a first register circuit. When the receiver circuit 110 uses the analog input AIN_2 as the output signal SO, the digital filter circuit 124 stores the second sampled results in a second register circuit and maintains the data (first sampled results) stored in the first register circuit. Therefore, when the receiver circuit 110 re-uses the analog input AIN_1 as the output signal SO, since the digital filter circuit 124 maintains the sampled results for the analog input AIN_1, the digital filter circuit 124 does not need to wait a settling time, such as a total time of 34 times sampling operations. Therefore, the digital filter circuit 124 provides the output data SODA quickly. Similarly, when the receiver circuit 110 re-uses the analog input AIN_2 as the output signal SO, since the digital filter circuit 124 maintains the data (i.e., the sampled results for the analog input AIN_2) stored in the second register circuit, the digital filter circuit 124 does not need to wait a settling time.

Additionally, since the receiver circuit 110 receives the sensing results (e.g., AIN_1 and AIN_2) from different sensing circuits, a single ADC circuit 100 is capable of converting different analog inputs so that the performance of the ADC circuit 100 is increased. Since there is no need to add many ADC circuits for different analog inputs, component costs can be significantly reduced. Additionally, although the digital filter circuit 124 maintains old sampled results, since the analog input AIN_1 and the analog input AIN_2 do not change significantly in a short period of time, the sampled results will not affect the accuracy of the output data SODA. Taking the analog input AIN_1 as an example, assuming that the analog input AIN_1 is related to the ambient temperature. In this case, since the ambient temperature does not be changed significantly, the digital filter circuit 124 is capable of providing the correct output data SODA.

Figure 2:
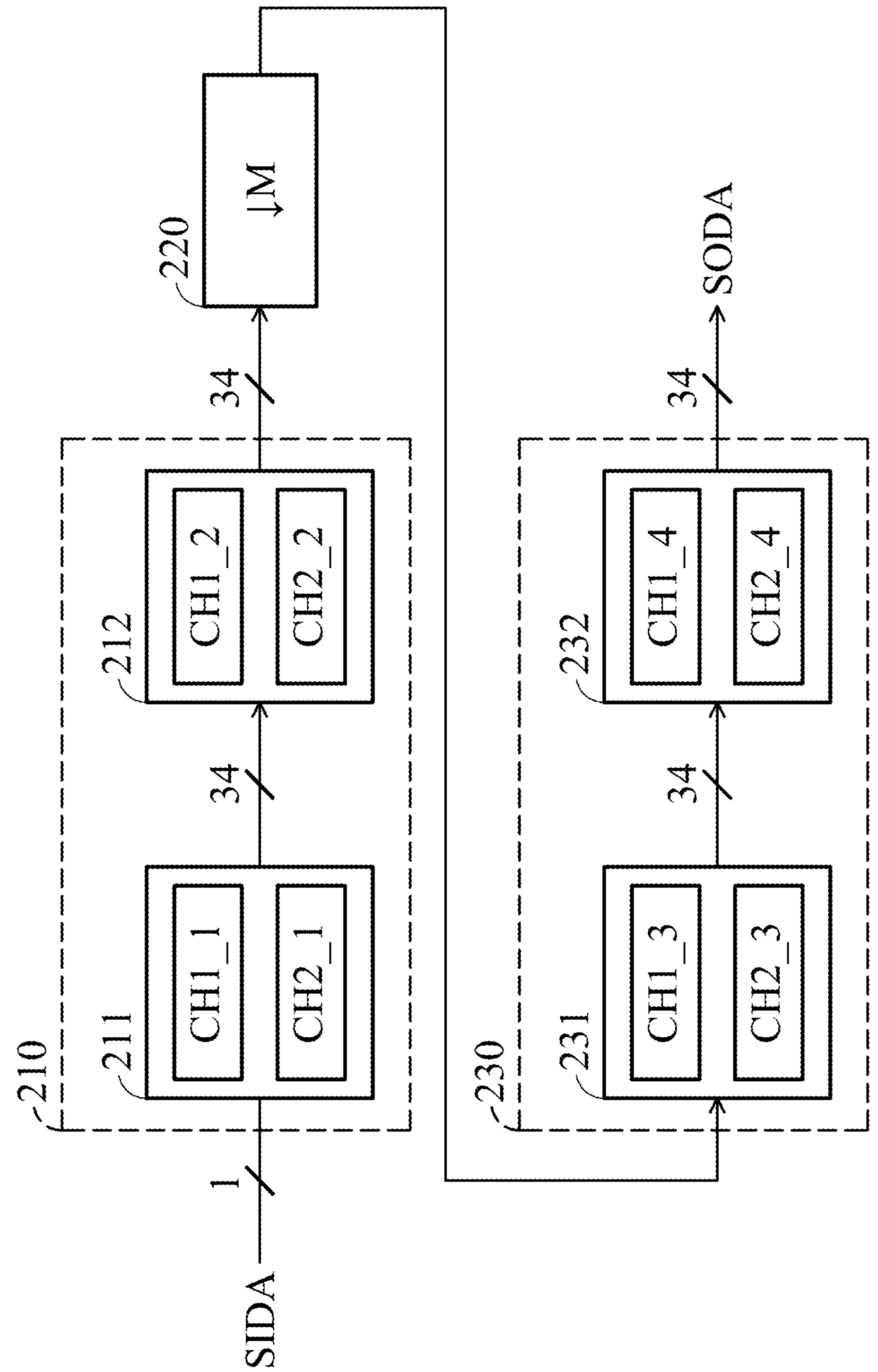
FIG. 2 is a block diagram of an exemplary embodiment of a digital filter circuit according to various aspects of the present disclosure.

FIG. 2 is a block diagram of an exemplary embodiment of a digital filter circuit according to various aspects of the present disclosure. As shown in FIG. 2, the digital filter circuit 124 comprises an integrator circuit 210, a frequency reduction circuit 220, and a comb filter circuit 230. In this embodiment, the digital filter circuit 124 is a cascaded integrator comb (CIC) filter.

The integrator circuit 210 comprises an integrator 211 and an integrator 212. The integrator 211 and the integrator 212 are connected in series. The integrator 211 comprises a register CH1_1 and a register CH2_1. The integrator 212 comprises a register CH1_2 and a register CH2_2. The register CH1_1 and register CH1_2 are configured to store the sampled results of the analog input AIN_1 from the channel 111. The register CH2_1 and register CH2_2 are configured to store the sampled results of the analog input AIN_2 from the channel 112. The number of integrators is not limited in the present disclosure. In other embodiment, the integrator circuit 210 comprises more integrators.

The frequency reduction circuit 220 is coupled between the integrator circuit 210 and the comb filter circuit 230. The frequency reduction circuit 220 down-samples the sampled results of the integrator 212 and then provides the down-sampling results to the comb filter circuit 230.

The comb filter circuit 230 comprises a comb filter 231 and a comb filter 232. The comb filter 231 and the comb filter 232 are connected in series. The comb filter 231 comprises a register CH1_3 and a register CH2_3. The comb filter 232 comprises a register CH1_4 and a register CH2_4. The register CH1_3 and the register CH1_4 are configured to store the sampled results of the analog input AIN_1 from the channel 111. The register CH2_3 and the register CH2_4 are configured to store the sampled results of the analog input AIN_2 from the channel 111. The number of comb filters is not limited in the present disclosure. In other embodiments, the comb filter circuit 230 comprises more comb filters.

The number of registers of each integrator and the number of registers of each comb filter are not limited in the present disclosure. In this embodiment, the number of registers of each integrator and the number of registers of each comb filter are related to the number of channels of the ADC circuit 100. For example, since the ADC circuit 100 comprises the channel 111 and the channel 112, the integrator 211 comprises two registers, the integrator 232 comprises two registers, the comb filter 231 comprises two registers, and the comb filter 232 comprises two registers. In other embodiment, when the ADC circuit 100 comprises more channels, each of the integrator 211 and the integrator 212, and the comb filter 231 and the comb filter 232 comprises more registers.

When the receiver circuit 110 uses the analog input AIN_1 as the output signal SO, the digital filter circuit 124 over-samples the input data SIDA to generate a plurality of first sampled results after processing by the differential amplifier 121, the integrator 122, the quantizer 123, and the DAC circuit 125. The digital filter circuit 124 stores the first sampled results in the registers CH1_1~CH1_4. In this case, the registers CH1_1~CH1_4 are served as a first register circuit. The digital filter circuit 124 generates the output data SODA according to the data stored in the registers CH1_1~CH1_4.

When the receiver circuit 110 uses the analog input AIN_2 as the output signal SO, the digital filter circuit 124 over-samples the input data SIDA to generate a plurality of second sampled results after processing by the differential amplifier 121, the integrator 122, the quantizer 123, and the DAC circuit 125. The digital filter circuit 124 stores the second sampled results in the registers CH2_1~CH2_4. In this case, the registers CH2_1~CH2_4 are served as a second register circuit. The digital filter circuit 124 generates the output data SODA according to the data stored in the registers CH2_1~CH2_4.

In some embodiments, while generating the output data SODA according to the data stored in the registers CH2_1~CH2_4, the digital filter circuit 124 holds on the data (i.e., the first sampled results) stored in the registers CH1_1~CH1_4. Similarly, generating the output data SODA according to the data stored in the registers CH1_1~CH1_4, the digital filter circuit 124 holds on the data (i.e., the second sampled results) stored in the registers CH2_1~CH2_4.

The number of bits of the sampled results is not limited in the present disclosure. In one embodiment, the number of bits of the sampled results is related to the number of times the digital filter circuit 124 performs the sampling operations. For example, assuming that the digital filter circuit 124 performs 34 sampling operations. In this case, the sampled results may have 34 bits.

Figure 3:
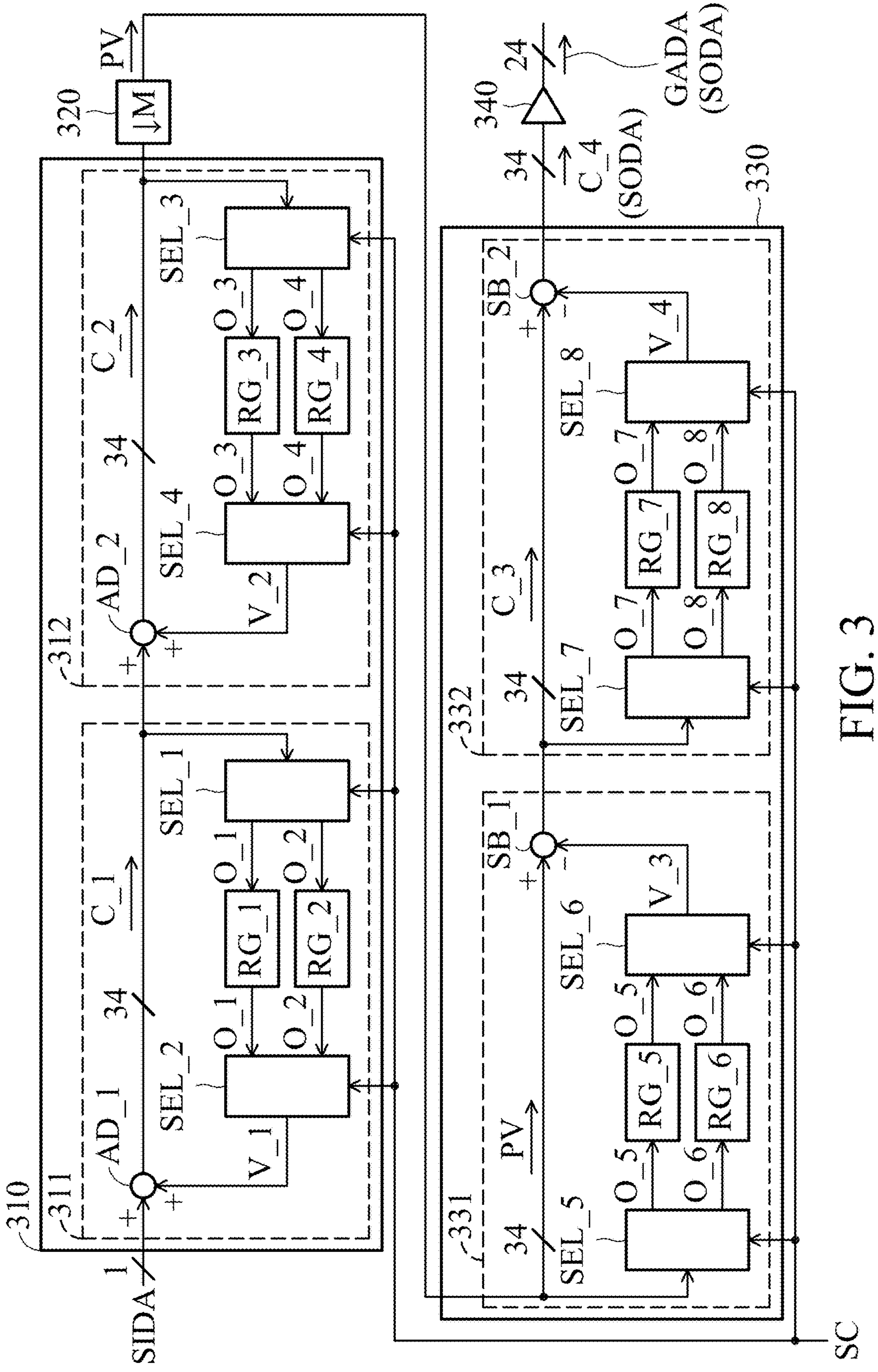
FIG. 3 is a schematic diagram of an exemplary embodiment of the digital filter circuit according to various aspects of the present disclosure.

FIG. 3 is a schematic diagram of an exemplary embodiment of the digital filter circuit according to various aspects of the present disclosure. The digital filter circuit 124 comprises an integrator circuit 310, a frequency reduction circuit 320, and a comb filter circuit 330. The integrator circuit 310 comprises integrators 311 and 312. The number of integrators is not limited in the present disclosure. In another embodiment, the integrator circuit 310 comprises more integrators.

The integrator 311 comprises an adder AD_1, selector circuits SEL_1 and SEL_2, and registers RG_1 and RG_2. The adder AD_1 adds the input data SIDA and a register value V_1 to generate a calculation value C_1. The selector circuit SEL_1 selects the calculation value C_1 as the output value O_1 or O_2 according to the control signal SC. For example, when the control signal SC matches a predetermined state (e.g., a low level), the selector circuit SEL_1 uses the calculation value C_1 as the output value O_1. When the control signal SC does not match a predetermined state, the selector circuit SEL_1 uses the calculation value C_1 as the output value O_2.

The register RG_1 and the register RG_2 are coupled to the selector circuit SEL_1. When the selector circuit SEL_1 uses the calculation value C_1 as the output value O_1, the register RG_1 stores the output value O_1. When the selector circuit SEL_1 uses the calculation value C_1 as the output value O_2, the register RG_2 stores the output value O_2.

The selector circuit SEL_2 is coupled to the register RG_1 and the register RG_2. The selector circuit SEL_2 reads the register RG_1 or RG_2 according to the control signal SC. For example, when the control signal SC matches a predetermined state, the selector circuit SEL_2 reads the register RG_1. The selector circuit SEL_2 uses the output value O_1 stored in the register RG_1 as the register value V_1 and provides the register value V_1 to the adder AD_1. When the control signal SC does not match a predetermined state, the selector circuit SEL_2 reads the register RG_2. The selector circuit SEL_2 uses the output value O_2 stored in the register RG_2 as the register value V_1 and provides the register value V_1 to the adder AD_1.

The integrator 312 is connected to the integrator 311 in series and comprises an adder AD_2, selector circuits SEL_3 and SEL_4, and registers RG_3 and RG_4. The adder AD_2 adds the calculation value C_1 and a register value V_2 to generate a calculation value C_2. The selector circuit SEL_3 selects the calculation value C_2 as the output value O_3 or O_4 according to the control signal SC. For example, when the control signal SC matches a predetermined state (e.g., a low level), the selector circuit SEL_3 uses the calculation value C_2 as the output value O_3. When the control signal SC does not match a predetermined state, the selector circuit SEL_3 uses the calculation value C_2 as the output value O_4.

The register RG_3 and the register RG_4 are coupled to the selector circuit SEL_3. When the selector circuit SEL_3 uses the calculation value C_2 as the output value O_3, the register RG_3 stores the output value O_3. When the selector circuit SEL_3 uses the calculation value C_2 as the output value O_4, the register RG_4 stores the output value O_4.

The selector circuit SEL_4 reads the register RG_3 or RG_4 according to the control signal SC. For example, when the control signal SC matches a predetermined state, the selector circuit SEL_4 reads the register RG_3. The selector circuit SEL_4 uses the output value O_3 stored in the register RG_3 as the register value V_2 and provides the register value V_2 to the adder AD_2. When the control signal SC does not match a predetermined state, the selector circuit SEL_4 reads the register RG_4. The selector circuit SEL_4 uses the output value O_4 stored in the register RG_4 as the register value V_2 and provides the register value V_2 to the adder AD_2.

The frequency reduction circuit 320 down-samples the calculation value C_2 to generate a processed value PV. The comb filter circuit 330 receives the processed value PV and comprises comb filters 331 and 332. In this embodiment, the number of comb filters is the same as the number of the integrators. The number of comb filters is not limited in the present disclosure. In other embodiments, the comb filter circuit 330 may comprise more comb filters.

The comb filter 331 comprises a subtractor SB_1, selector circuits SEL_5 and SEL_6, and registers RG_5 and RG_6. The subtractor SB_1 subtracts a register value V_3 from the processed value PV to generate a calculation value C_3. The selector circuit SEL_5 selects the processed value PV as the output value O_5 or O_6 according to the control signal SC. For example, when the control signal SC matches a predetermined state (e.g., a low level), the selector circuit SEL_5 uses the processed value PV as the output value O_5. When the control signal SC does not match a predetermined state, the selector circuit SEL_5 uses the processed value PV as the output value O_6.

The register RG_5 and the register RG_6 are coupled to the selector circuit SEL_5. When the selector circuit SEL_5 uses the processed value PV as the output value O_5, the register RG_5 stores the output value O_5. When the selector circuit SEL_5 uses the processed value PV as the output value O_6, the register RG_6 stores the output value O_6.

The selector circuit SEL_6 is coupled to the registers RG_5 and RG_6. The selector circuit SEL_6 reads the register RG_5 or RG_6 according to the control signal SC. For example, when the control signal SC matches a predetermined state, the selector circuit SEL_6 reads the register RG_5. The selector circuit SEL_6 uses the output value O_5 stored in the register RG_5 as the register value V_3 and provides the register value V_3 to the subtractor SB_1. When the control signal SC does not match a predetermined state, the selector circuit SEL_6 reads the register RG_6. The selector circuit SEL_6 uses the output value O_6 stored in the register RG_6 as the register value V_3 and provides the register value V_3 to the subtractor SB_1.

The comb filter 332 comprises a subtractor SB_2, selector circuits SEL_7 and SEL_8, and registers RG_7 and RG_8. The subtractor SB_2 subtracts a register value V_4 from the calculation value C_3 to generate a calculation value C_4. The selector circuit SEL_7 selects the calculation value C_3 as the output value O_7 or O_8 according to the control signal SC. For example, when the control signal SC matches a predetermined state (e.g., a low level), the selector circuit SEL_7 uses the calculation value C_3 as the output value O_7. When the control signal SC does not match a predetermined state, the selector circuit SEL_7 uses the calculation value C_3 as the output value O_8.

The register RG_7 and the register RG_8 are coupled to the selector circuit SEL_7. When the selector circuit SEL_7 uses the calculation value C_3 as the output value O_7, the register RG_7 stores the output value O_7. When the selector circuit SEL_7 uses the calculation value C_3 as the output value O_8, the register RG_8 stores the output value O_8.

The selector circuit SEL_8 is coupled to the registers RG_7 and RG_8. The selector circuit SEL_8 reads the register RG_7 or RG_8 according to the control signal SC. For example, when the control signal SC matches a predetermined state, the selector circuit SEL_8 reads the register RG_75. The selector circuit SEL_8 uses the output value O_7 stored in the register RG_7 as the register value V_4 and provides the register value V_4 to the subtractor SB_2. When the control signal SC does not match a predetermined state, the selector circuit SEL_8 reads the register RG_8. The selector circuit SEL_8 uses the output value O_8 stored in the register RG_8 as the register value V_4 and provides the register value V_4 to the subtractor SB_2.

In one embodiment, the digital filter circuit 124 directly uses the calculation value C_4 as the output data SODA. In another embodiment, the digital filter circuit 124 further comprises a gain adjustment circuit 340. The gain adjustment circuit 340 may shift the calculation value C_4 to generate shifted data GADA. In one embodiment, the gain adjustment circuit 340 may use the values of higher 24 bits of the calculation value C_4 as the shifted data GADA. In this case, the shifted data GADA is served as the output data SODA.

In some embodiments, the input data SIDA has one bit, and each of the calculation values C_1~C_4 has many bits, such as 32 bits. Additionally, the number of bits of the shifted data GADA may be less than the number of bits of each of the calculation values C_1~C_4.

Figure 4:
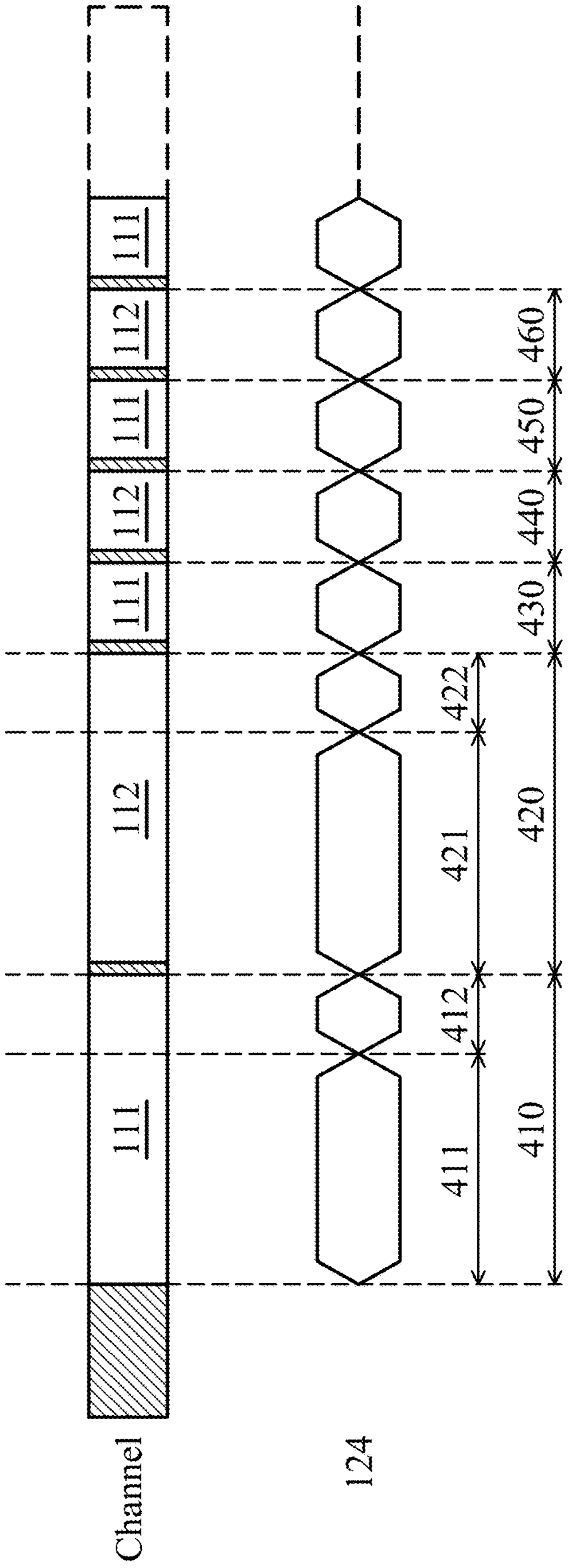
FIG. 4 is a schematic diagram of an exemplary embodiment of the operation of the ADC circuit according to various aspects of the present disclosure.

FIG. 4 is a schematic diagram of an exemplary embodiment of the operation of the ADC circuit according to various aspects of the present disclosure. Refer to FIG. 1, the receiver circuit 110 uses the analog input AIN_1 from the channel 111 as the output signal SO in the operation period 410. Therefore, the digital filter circuit 124 performs a sampling operation and a converting operation for the input data SIDA.

In settling period 411, the digital filter circuit 124 samples the input data SIDA many times to generate a plurality of first sampled results and stores the first sampled results in a first register circuit. The number of times the digital filter circuit 124 performs sampling operations is not limited in the present disclosure. In one embodiment, the digital filter circuit 124 performs the sampling operation for 24 times. In conversion period 412, the digital filter circuit 124 converts the first sampled results to generate the output data SODA.

In operation period 420, the receiver circuit 110 uses the analog input AIN_2 from the channel 112 as the output signal SO. Therefore, the digital filter circuit 124 performs a sampling operation and a converting operation for the input data SIDA. In settling period 421, the digital filter circuit 124 samples the input data SIDA many times to generate a plurality of second sampled results and stores the second sampled results in a second register circuit. In one embodiment, the digital filter circuit 124 maintains the first sampled results stored in the first register circuit. In conversion period 422, the digital filter circuit 124 converts the second sampled results to generate the output data SODA.

In operation period 430, the receiver circuit 110 re-uses the analog input AIN_1 from the channel 111 as the output signal SO. Since the digital filter circuit 124 maintains the sampled results of the previous analog input AIN_1, the digital filter circuit 124 performs the sampling operation for fewer times. For example, the digital filter circuit 124 performs the sampling operation for 8 times. Since the number of performing the sampling operations is reduced, the digital filter circuit 124 is capable of providing the output data SODA quickly.

In operation period 440, the receiver circuit 110 re-uses the analog input AIN_2 from the channel 112 as the output signal SO. Since the digital filter circuit 124 maintains the sampled results of the previous analog input AIN_2, the digital filter circuit 124 performs the sampling operation for fewer times. Therefore, the power consumption of the digital filter circuit 124 is reduced. Additionally, since the digital filter circuit 124 provides the output data SODA quickly, the performance of the digital filter circuit 124 is increased.

In operation period 450, the receiver circuit 110 re-uses the analog input AIN_1 from the channel 111 as the output signal SO. The number of sampling operations performed by the digital filter circuit 124 during the operation period 450 is less than the number of sampling operations performed by the digital filter circuit 124 during the operation period 410. Therefore, the digital filter circuit 124 is capable of providing the output data SODA quickly. Similarly, the receiver circuit 110 re-uses the analog input AIN_2 from the channel 112 as the output signal SO in operation period 460. The number of sampling operations performed by the digital filter circuit 124 during the operation period 460 is less than the number of sampling operations performed by the digital filter circuit 124 during the operation period 420. Therefore, the digital filter circuit 124 is capable of providing the output data SODA quickly.

Figure 5:
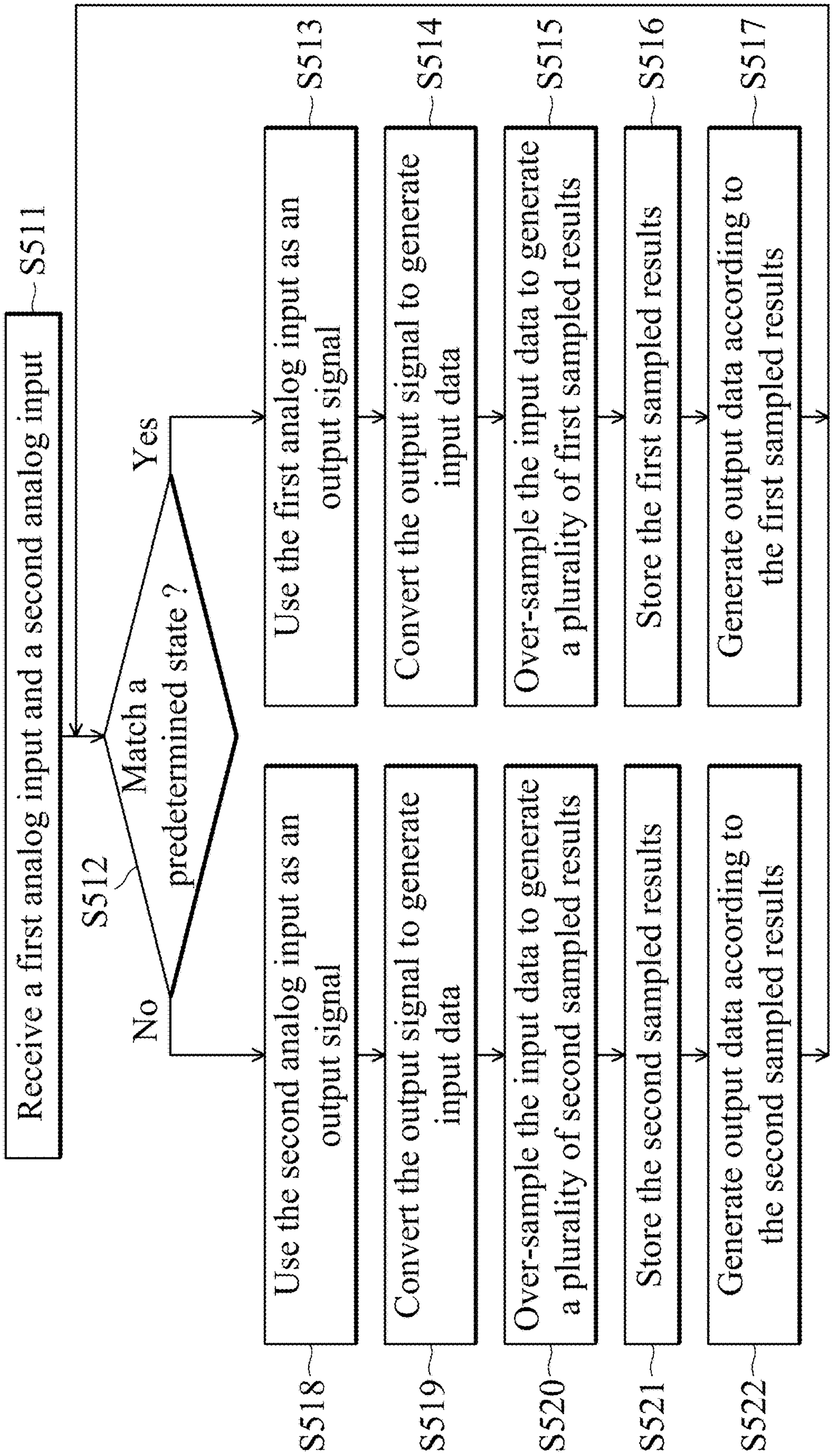
FIG. 5 is a flowchart of an exemplary embodiment of a control method according to various aspects of the present disclosure.

FIG. 5 is a flowchart of an exemplary embodiment of a control method according to various aspects of the present disclosure. The control method is applied in an ADC. The control method may take the form of a program code. When the program code is loaded into and executed by a machine such as a computer, the machine thereby becomes an ADC or a digital filter circuit for practicing the methods.

First, a first analog input and a second analog input are received (step S511). In one embodiment, the first analog input and the second analog input are continuously and alternately used as an output signal SO. The sources of the first analog input and the second analog input are not limited in the present disclosure. In one embodiment, the first analog input is provided by a first sensing circuit. The first sensing circuit detects a physical characteristic (e.g., a temperature or a humidity) or an electrical characteristic (a voltage, a current, or a frequency) and provides the detection result as a first analog input. In another embodiment, the second analog input is provided by a second sensing circuit. The second sensing circuit detects a physical characteristic or an electrical characteristic and provides the detection result as a second analog input. In some embodiments, the physical characteristic or the electrical characteristic sensed by the first sensing circuit may be the same as or different from the physical characteristic or the electrical characteristic sensed by the second sensing circuit.

A control signal is determined whether to match a predetermined state (step S512). When the control signal matches a predetermined state (e.g., a low level), the first analog input is used as an output signal (step S513). Next, the output signal is converted to generate an input data (step S514). In one embodiment, step S514 is performed to convert the output signal from an analog signal into a digital signal.

Then the input data is over-sampled to generate a plurality of first sampled results (step S515). In one embodiment, the number of bits of input data is less than the number of bits of one of the first sampled results. Next, the first sampled results are stored (step S516). In one embodiment, the first sampled results are stored in a first register circuit. Then, the first sampled results are utilized to generate output data (step S517) and then step S512 is performed. In one embodiment, step S517 is performed to use one of the first sampled results as the output data.

When the control signal does not match a predetermined state, the second analog input is used as an output signal (step S518). Next, the output signal is converted to generate an input data (step S519). In one embodiment, step S519 is performed to convert the output signal from an analog signal into a digital signal.

Then the input data is over-sampled to generate a plurality of second sampled results (step S520). In one embodiment, the number of bits of input data is less than the number of bits of one of the second sampled results. Next, the second sampled results are stored (step S521). In one embodiment, the second sampled results are stored in a second register circuit. The first register circuit is independent of the second register circuit. Then, the second sampled results are utilized to generate output data (step S522) and then step S512 is performed. In one embodiment, step S522 is performed to use one of the second sampled results as the output data.

In some embodiments, when the second sampled results are stored in the second register circuit, the first sampled results are maintained in the first register circuit in step S521. Similarly, when the first sampled results are stored in the first register circuit, the second sampled results are maintained in the second register circuit in step S516.

It will be understood that when an element or layer is referred to as being "on", "connected to" or "coupled to" another element or layer, it can be directly on, connected or coupled to the other element or layer or intervening elements or layers may be present. In contrast, when an element or layer is referred to as be "directly on", "directly connected to" or "directly coupled to" another element or layer, there are no intervening elements or layers present.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a ADC circuit and a digital filter circuit for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a ADC circuit and a digital filter circuit for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another. In the following claims, the terms "first," "second," etc. are used merely as labels, and are not intended to impose numerical requirements on their objects.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter (ADC) circuit, comprising:

a receiver circuit receiving a first analog input and a second analog input and using the first analog input or the second analog input as an output signal according to a control signal; and a delta-sigma ADC converting the output signal to generate output data and comprising:

a differential amplifier amplifying a difference between the output signal and a reference signal to generate an amplified signal;

an integrator accumulating the amplified signal to generate an integrated signal;

a quantizer quantizing the integrated signal to generate input data;

a digital-to-analog converter (DAC) circuit converting the input data to generate the reference signal; and a digital filter circuit over-sampling the input data according to the control signal to generate the output data, wherein:

in response to the control signal matching a predetermined state:

the receiver circuit uses the first analog input as the output signal;

the digital filter circuit over-samples the input data to generate a plurality of first sampled results and stores the first sampled results in a first register circuit; and the digital filter circuit generates the output data according to the first sampled results, in response to the control signal not matching the predetermined state:

the receiver circuit uses the second analog input as the output signal;

the digital filter circuit over-samples the input data to generate a plurality of second sampled results and stores the second sampled results in a second register circuit; and the digital filter circuit generates the output data according to the second sampled results, the digital filter circuit comprises:

an integrator circuit comprising a plurality of integrators which are connected in series and store both the first sampled results and the second sampled results;

a comb filter circuit comprising a plurality of comb filters which are connected in series and store both the first sampled results and the second sampled results; and a frequency reduction circuit coupled between the integrator circuit and the comb filter circuit.

2. The ADC circuit as claimed in claim 1, wherein the second sampled results are stored in the second register circuit while the digital filter circuit generates the output data according to the first sampled results.

3. An analog-to-digital converter (ADC) circuit, comprising:

a receiver circuit receiving a first analog input and a second analog input and using the first analog input or the second analog input as an output signal according to a control signal; and a delta-sigma ADC converting the output signal to generate output data and comprising:

a differential amplifier amplifying a difference between the output signal and a reference signal to generate an amplified signal;

an integrator accumulating the amplified signal to generate an integrated signal;

a quantizer quantizing the integrated signal to generate input data;

a digital-to-analog converter (DAC) circuit converting the input data to generate the reference signal; and a digital filter circuit over-sampling the input data according to the control signal to generate the output data, wherein:

in response to the control signal matching a predetermined state:

the receiver circuit uses the first analog input as the output signal;

the digital filter circuit over-samples the input data to generate a plurality of first sampled results and stores the first sampled results in a first register circuit; and the digital filter circuit generates the output data according to the first sampled results, in response to the control signal not matching the predetermined state:

the receiver circuit uses the second analog input as the output signal;

the digital filter circuit over-samples the input data to generate a plurality of second sampled results and stores the second sampled results in a second register circuit; and the digital filter circuit generates the output data according to the second sampled results, the digital filter circuit comprises:

an integrator circuit comprising:

a first integrator comprising:

a first adder adding the input data and a first register value to generate a first calculation value;

a first selector circuit selecting the first calculation value as a first output value or a second output value according to the control signal;

a first register storing the first output value;

a second register storing the second output value;

a second selector circuit selecting the first output value stored in the first register or the second output value stored in the second register as the first register value according to the control signal;

a second integrator connected to the first integrator in series and comprising:

a second adder adding the first calculation value and a second register value to generate a second calculation value;

a third selector circuit selecting the second calculation value as a third output value or a fourth output value according to the control signal;

a third register storing the third output value;

a fourth register storing the fourth output value;

a fourth selector circuit selecting the third output value stored in the third register or the fourth output value stored in the fourth register as the second register value according to the control signal;

a frequency reduction circuit down-sampling the second calculation value to generate a processed value;

a comb filter circuit comprising:

a first comb filter comprising:

a first subtractor subtracting a third register value from the processed value to generate a third calculation value;

a fifth selector circuit selecting the processed value as a fifth output value or a sixth output value according to the control signal;

a fifth register storing the fifth output value;

a sixth register storing the sixth output value;

a sixth selector circuit selecting the fifth output value stored in the fifth register or the sixth output value stored in the sixth register as the third register value according to the control signal;

a second comb filter comprising:

a second subtractor subtracting a fourth register value from the third calculation value to generate a fourth calculation value;

a seventh selector circuit selecting the third calculation value as a seventh output value or an eighth output value according to the control signal;

a seventh register storing the seventh output value;

an eighth register storing the eighth output value;

an eighth selector circuit selecting the seventh output value stored in the seventh register or the eighth output value stored in the eighth register as the fourth register value according to the control signal.

4. The ADC circuit as claimed in claim 3, wherein the first register circuit comprises the first register, the third register, the fifth register, and the seventh register, and the second register circuit comprises the second register, the fourth register, the sixth register, and the eighth register.

5. The ADC circuit as claimed in claim 1, further comprising:

a first channel receiving the first analog input generated by a first sensing circuit and providing the first analog input to the receiver circuit;

a second channel receiving the second analog input generated by a second sensing circuit and providing the second analog input to the receiver circuit.

6. The ADC circuit as claimed in claim 5, wherein:

in response to the receiver circuit using the first analog input as the output signal, the digital filter circuit over-samples the input data to generate a plurality of first sampled results and stores the first sampled results in a first register circuit, in response to the receiver circuit using the second analog input as the output signal, the digital filter circuit over-samples the input data to generate a plurality of second sampled results and stores the second sampled results in a second register circuit, and the first register circuit is independent of the second register circuit.

7. The ADC circuit as claimed in claim 1, further comprising:

a programmable gain amplifier coupled between the receiver circuit and the differential amplifier to amplify the output signal.

8. The ADC circuit as claimed in claim 1, further comprising:
a control circuit directing the control signal to change between a first state and a second state.

9. A digital filter circuit over-sampling input data to generate output data and comprising:
an integrator circuit comprising:
a first integrator comprising:
a first adder adding the input data and a first register value to generate a first calculation value;
a first selector circuit selecting the first calculation value as a first output value or a second output value according to a control signal;
a first register storing the first output value;
a second register storing the second output value;
a second selector circuit selecting the first output value stored in the first register or the second output value stored in the second register as the first register value according to the control signal;
a second integrator connected to the first integrator in series and comprising:
a second adder adding the first calculation value and a second register value to generate a second calculation value;
a third selector circuit selecting the second calculation value as a third output value or a fourth output value according to the control signal;
a third register storing the third output value;
a fourth register storing the fourth output value;
a fourth selector circuit selecting the third output value stored in the third register or the fourth output value stored in the fourth register as the second register value according to the control signal;
a frequency reduction circuit down-sampling the second calculation value to generate a processed value;
a comb filter circuit comprising:
a first comb filter comprising:
a first subtractor subtracting a third register value from the processed value to generate a third calculation value;
a fifth selector circuit selecting the processed value as a fifth output value or a sixth output value according to the control signal;
a fifth register storing the fifth output value;
a sixth register storing the sixth output value;
a sixth selector circuit selecting the fifth output value stored in the fifth register or the sixth output value stored in the sixth register as the third register value according to the control signal;
a second comb filter comprising:
a second subtractor subtracting a fourth register value from the third calculation value to generate a fourth calculation value;
a seventh selector circuit selecting the third calculation value as a seventh output value or an eighth output value according to the control signal;
a seventh register storing the seventh output value;
an eighth register storing the eighth output value;
an eighth selector circuit selecting the seventh output value stored in the seventh register or the eighth output value stored in the eighth register as the fourth register value according to the control signal.

10. The digital filter circuit as claimed in claim 9, further comprising:
a gain adjustment circuit shifting the fourth calculation value to generate the output data.

11. The digital filter circuit as claimed in claim 10, wherein a number of bits of output data is less than a number of bits of fourth calculation value.

12. The digital filter circuit as claimed in claim 9, wherein in response to the control signal matching a predetermined state:
the first selector circuit selects the first calculation value as the first output value,
the second selector circuit selects the first output value stored in the first register as the first register value,
the third selector circuit selects the second calculation value as the third output value,
the fourth selector circuit selects the third output value stored in the third register as the second register value,
the fifth selector circuit selects the processed value as the fifth output value,
the sixth selector circuit selects the fifth output value stored in the fifth register as the third register value,
the seventh selector circuit selects the third calculation value as the seventh output value, and
the eighth selector circuit selects the seventh output value stored in the seventh register as the fourth register value.

13. The digital filter circuit as claimed in claim 12, wherein in response to the control signal not matching the predetermined state:
the first selector circuit selects the first calculation value as the second output value,
the second selector circuit selects the second output value stored in the second register as the first register value,
the third selector circuit selects the second calculation value as the fourth output value,
the fourth selector circuit selects the fourth output value stored in the fourth register as the second register value,
the fifth selector circuit selects the processed value as the sixth output value,
the sixth selector circuit selects the sixth output value stored in the sixth register as the third register value,
the seventh selector circuit selects the third calculation value as the eighth output value, and
the eighth selector circuit selects the eighth output value stored in the eighth register as the fourth register value.

14. The ADC circuit as claimed in claim 3, wherein the second sampled results are stored in the second register circuit while the digital filter circuit generates the output data according to the first sampled results.

15. The ADC circuit as claimed in claim 3, further comprising:
a first channel receiving the first analog input generated by a first sensing circuit and providing the first analog input to the receiver circuit;
a second channel receiving the second analog input generated by a second sensing circuit and providing the second analog input to the receiver circuit.

16. The ADC circuit as claimed in claim 15, wherein:
in response to the receiver circuit using the first analog input as the output signal, the digital filter circuit over-samples the input data to generate a plurality of first sampled results and stores the first sampled results in a first register circuit,
in response to the receiver circuit using the second analog input as the output signal, the digital filter circuit over-samples the input data to generate a plurality of second sampled results and stores the second sampled results in a second register circuit, and the first register circuit is independent of the second register circuit.

17. The ADC circuit as claimed in claim 3, further comprising:

a programmable gain amplifier coupled between the receiver circuit and the differential amplifier delta-sigma ADC to amplify the output signal.

18. The ADC circuit as claimed in claim 3, further comprising:

a control circuit directing the control signal to change between a first state and a second state.

* * * * *